United States Patent [19]

Chantry et al.

[11] Patent Number: 5,192,921
[45] Date of Patent: Mar. 9, 1993

[54] MINIATURIZED ATOMIC FREQUENCY STANDARD

[75] Inventors: Peter J. Chantry, Churchill Boro; Robert W. Weinert, Monroeville; Salvador H. Talisa, Edgewood; Bruce R. McAvoy, Pittsburgh; Thomas J. Smith, Jr., Salem Twp., Westmoreland County; Irving Liberman, Pittsburgh; Harvey C. Nathanson, Pittsburgh; and all Pa.

[73] Assignee: Westinghouse Electric Corp., Pittsburgh, Pa.

[21] Appl. No.: 815,677

[22] Filed: Dec. 31, 1991

[51] Int. Cl.$^5$ .............................................. H03L 7/00
[52] U.S. Cl. ...................................... 331/3; 331/94.1
[58] Field of Search .................... 331/3, 94.1; 368/118, 368/155, 156

[56] References Cited

U.S. PATENT DOCUMENTS

| | | | |
|---|---|---|---|
| 4,462,006 | 7/1984 | Fowks | 331/94.1 |
| 4,476,445 | 10/1984 | Riley, Jr. | 331/94.1 |
| 4,494,085 | 1/1985 | Goldberg | 331/94.1 |
| 4,943,955 | 7/1990 | Rabian | 368/156 |
| 4,961,119 | 10/1990 | Irish | 331/94.1 |

OTHER PUBLICATIONS

L. L. Lewis, "Miniature Optically Pumped Cesium Standards", 45th *Annual Symposium on Frequency Control*, Feb. 1991, pp. 521-533.

*Primary Examiner*—Robert J. Pascal
*Attorney, Agent, or Firm*—David G. Maire

[57] ABSTRACT

A cell-type atomic frequency standard utilizing a miniaturized gas cell and microwave exciter along with a diode laser light source. The intensity of the diode laser light source counterbalances the penalties associated with the small gas cell. The signal produced by an oscillator is applied to a vapor within the gas cell by a miniature helix coil, or LC gap conductor, or a microstrip exciter. With the dimensions of the gas cell not exceeding one-half the wavelength of the signal, and the associated circuitry formed on a semiconductor substrate, the resulting frequency standard is reduced in size by two orders of magnitude when compared to prior art devices of comparable accuracy.

30 Claims, 6 Drawing Sheets

MINIATURIZED ATOMIC FREQUENCY STANDARD

BACKGROUND OF THE INVENTION:

This invention relates generally to the field of frequency standards, and in particular, it concerns a miniaturized atomic frequency standard.

Modern military, aerospace and communications systems often require extremely stable and accurate timing devices, with the overall size, weight and ruggedness of the device being important considerations. Atomic frequency standards have for some time been used in such applications, for example the atomic clock disclosed in U.S. Pat. No. 4,943,955 issued to Rabian et al. However, atomic frequency standards have the disadvantages of bulky component construction and high cost. U.S. Pat. No. 4,494,085 issued to Goldberg describes one technique for reducing the size of an atomic clock by reducing the size of its microwave cavity. Goldberg decreases the overall size of the cavity by placing both a filter cell and an absorption cell in the cavity. An alternative to obtaining a miniature atomic frequency standard is the harmonic optical oscillator described in U.S. Pat. No. 4,961,119 issued to Irish. That patent teaches a solid state device integrated on a microchip, with its inherent size and weight advantages, however, that device is expected to maintain an accuracy of only about ½ second per year, far less than the capability of an atomic frequency standard.

L. L. Lewis is attempting to reduce the size of a cesium beam atomic frequency device by using shorter beam lengths and a single microwave interaction region, as described in his article entitled *Miniature Optically Pumped Cesium Standards*, published by the IEEE in the Transactions of the Forty-Fifth Annual Symposium on Frequency Control, 1991. The overall volume goal of this work is one liter—about the size of existing rubidium cell devices.

Therefore, a need still exists for a highly accurate frequency standard with a reduced size compared to existing devices.

SUMMARY

In light of the size and accuracy limitations of existing frequency standards, it is an object of this invention to describe an atomic frequency standard which is of reduced size and which has no reduction in accuracy when compared to prior art devices. Accordingly, an atomic frequency standard is described which utilizes a miniature gas cell and microwave exciter along with a laser diode light source. An atomic frequency standard built in accordance with this invention includes an oscillator, a gas cell containing a vapor, a conductor operable to couple the oscillator signal to the vapor, a laser diode light source operable to pass light through the vapor, means for detecting the light passing through the vapor, and a means for controlling the frequency of the oscillator signal in response to the amount of light detected by the detector means. The conductor carrying the oscillator signal may be a helix coil or an LC gap conductor formed on the outside of the gas cell, or alternatively it may be part of a microstrip exciter. Because the dimensions of the gas cell are made no more than one-half the wavelength of the oscillator signal, the overall size of an atomic frequency standard built in accordance with this invention can be less than 12 cm³.

DETAILED DESCRIPTION OF THE INVENTION

An atomic frequency standard operates by sensing transitions between two hyperfine levels of the ground state of an atom. Candidate atoms are selected by virtue of having singlet ($J=\frac{1}{2}$) electronic ground states, resulting in a simple two-level hyperfine structure. Of particular interest are those atoms whose hyperfine levels are separated by routinely available microwave frequencies, and in particular, only two types have been extensively engineered—the cesium beam and the rubidium cell types. The precision of a beam device depends on the interaction of a state selected atomic beam with a microwave field. The precision with which this interaction can be measured depends on the interaction time, placing a lower limit of typically 10 to 20 cm on the length of such devices. For this reason the beam type of device is not amenable to significant reduction of size.

Figure 1:
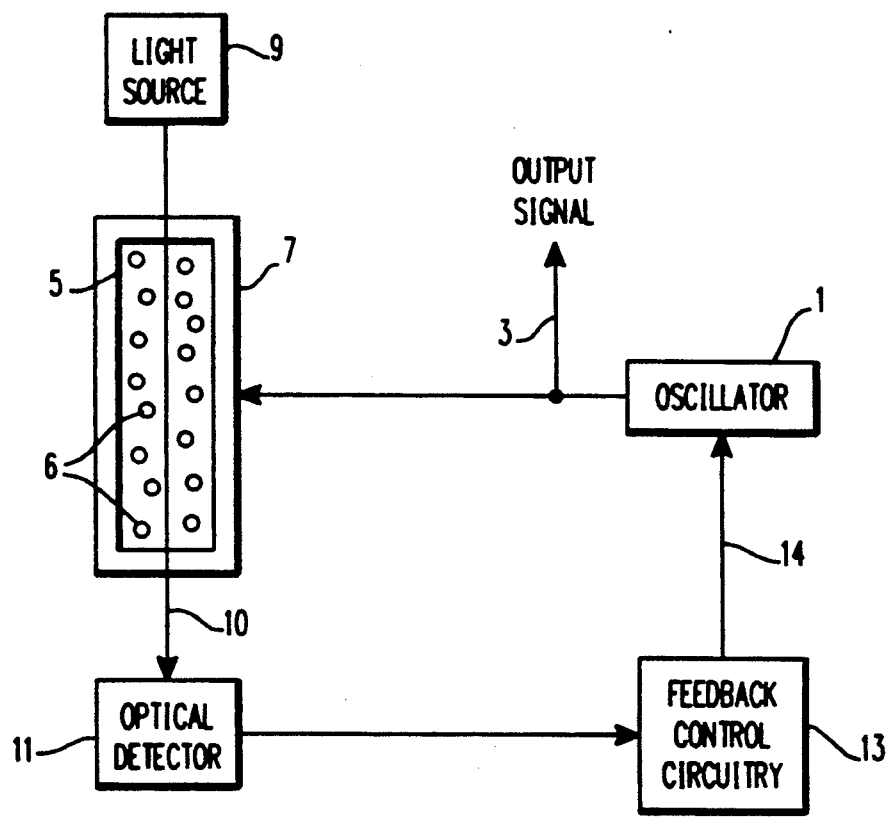
FIG. 1 is a schematic illustration of a prior art cell type atomic frequency standard.

FIG. 1 is a schematic illustration of a cell type atomic frequency standard which is the subject of this invention. In FIG. 1 a crystal oscillator 1 is controlled to provide a stable frequency output signal 3. The output of the oscillator is also used to excite an alkali metal vapor 6 in a gas cell 5 which is located within a microwave cavity 7. A source of light 9 is positioned to pass a beam of light 10 through the vapor 6 to an optical detector 11. The source of light 9 is designed to provide light with a predetermined wavelength which will be absorbed by the vapor atoms in a ground state, causing them to move to an excited energy state. For cesium atoms, light with a wavelength of 852 nm will pump cesium atoms from the F=3 hyperfine level of the $6^2S_{\frac{1}{2}}$ ground state to the F'=2,3,4 levels of the $6^2P_{3/2}$ resonance state. Atoms in the F=4 hyperfine state do not absorb light of this wavelength, therefore, once the F3 state is depopulated, the amount of light passing through the vapor 6 to the optical detector 11 will increase. Collisional quenching and spontaneous decay of atoms in the $6^2P_{3/2}$ state tend to repopulate both the F=3 and F=4 hyperfine levels of the ground state, but the relaxation rate between these states is sufficiently slow that depopulation of the F=3 level will occur for quite modest optical pump powers. The resulting imbalance in the populations of the two hyperfine levels of the ground state provides a sensitivity to a microwave field. When the oscillator 1 is operated at the hyperfine magnetic dipole transition frequency, approximately 9.19 GHz for cesium vapor, it tends to re-equilibrate the F=3 and F=4 level populations by stimulating absorption and emission events. By repopulating the F=3 level, the microwave energy of the oscillator 1 functions to increase the amount of light absorbed by the vapor 6. Therefore, the amount of light passing through the gas cell 5 to detector 11 will decrease to a minimum value when the frequency of the oscillator 1 is precisely at the desired hyperfine magnetic dipole transition frequency. The output from the optical detector 11 is used as input for feedback control circuitry 13 which in turn produces a signal 14 for controlling the frequency of the oscillator 1 to the desired frequency. In order to intensify the microwave field at the gas cell 5, the microwave cavity 7 is designed to be near or at resonance at the target frequency of the oscillator 1.

In order to reduce the overall size of a cell type atomic frequency standard, the size of the microwave cavity and gas cell must be minimized. An assessment of the possibilities for miniaturizing the microwave cavity led to the conclusion that cesium is a preferred vapor for the gas cell. A microwave cavity normally has at least two of its three dimensions comparable to the wavelength. For this reason, cesium operating at 9.19 GHz (wavelength =3.3 cm) is preferable to rubidium operating at 6.83 GHz (wavelength=4.4 cm), since this results in approximately a halving of the required cavity volume. An additional advantage is a reduction in the magnetic field sensitivity of the hyperfine transition.

Figure 2:
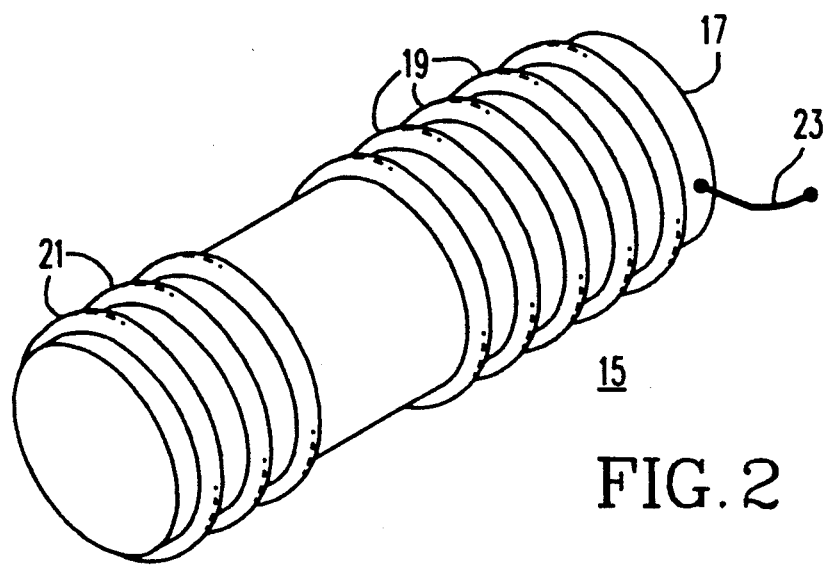
FIG. 2 is a plan view of a slow-wave helical exciter in accordance with this invention.

The object of this invention necessitates a microwave cavity design with minimum dimensions. One possibility is a rectangular $TE_{10}$ cavity loaded with a low loss dielectric material. An alternative to cavity designs is illustrated by the slow-wave helical exciter 15 of FIG. 2. This design consists of a gas cell 17 with a conductor 19 formed around its outside surface. The conductor 19 can be in contact with the surface of the gas cell 17 or sufficiently near the gas cell 17 to operatively couple a signal carried by the conductor 19 to the vapor (not shown) within the gas cell 17. The conductor 19 can be formed as a helix, with design parameters selected so as to support a standing or running wave when coupled to an input signal of the desired frequency. The circumference of the gas cell 17 should be limited to no more than one-half the wavelength of the signal, in order to maintain the coil as non-radiating, thereby increasing the efficiency of the coupling of the signal to the vapor within the gas cell 17. The conductor 19 can be formed by winding wire onto the outside of the gas cell 17, or a tape helix can be formed by depositing a metal coating onto the entire outer surface of the gas cell 17 and then selectively removing metal by etching to form the desired conductor shape. The helical exciter's loaded Q is comparable to that of a rectangular cavity (approximately 80), but it is more difficult to tune. The H field pattern within the coil has radial and axial components, with the latter having a minimum on the axis where one would prefer it to be strongest. Nevertheless, measurements have shown that this type of exciter is useful in an atomic frequency standard application. With the size of the gas cell 17 being minimized such that its circumference is no more than one-half the wavelength of the input signal, a fraction of a microwatt is sufficient power to provide the necessary field penetration for excitation of the contained vapor. This power level can be conveniently provided by MOS circuitry. The gas cell 17 preferably has outside dimensions of no more than 6 mm diameter by 18 mm length, and an internal volume of no more than 100 cubic millimeters. If thermal isolation of this device is obtained by vacuum encapsulation, the container (not shown) may also serve as a shield for the helix as is known in traveling wave tube art. Excitation of the conductor 19 may be accomplished by a second, short, bifilar helix 21 wound at the input and/or output of the main conductor helix 19. In addition to performing as a microwave transducer, the bifilar helix windings 21 may serve as a heater as part of a temperature control system for the gas cell 17. Such a temperature control system would utilize a temperature sensor 23, which is located either within the volume of the gas cell 17 or on its surface. The main conductor helix 19 may also serve as a heater, which may involve pitch changes leading to a filter helix.

Figure 3:
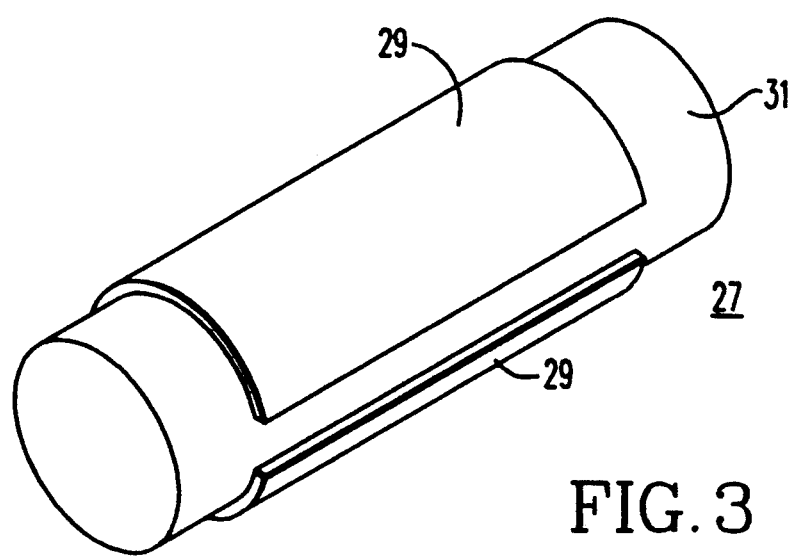
FIG. 3 is a plan view of an LC gap exciter.

An alternative miniature microwave exciter design is illustrated by the LC gap exciter 27 of FIG. 3, where an LC gap conductor 29 is formed on or around a gas cell 31. The LC gap conductor 29 is operable to carry the digital signal from the oscillator of an atomic frequency standard, and it serves to provide an efficient electromagnetic coupling to the vapor (not shown) contained within gas cell 31.

Figure 4:
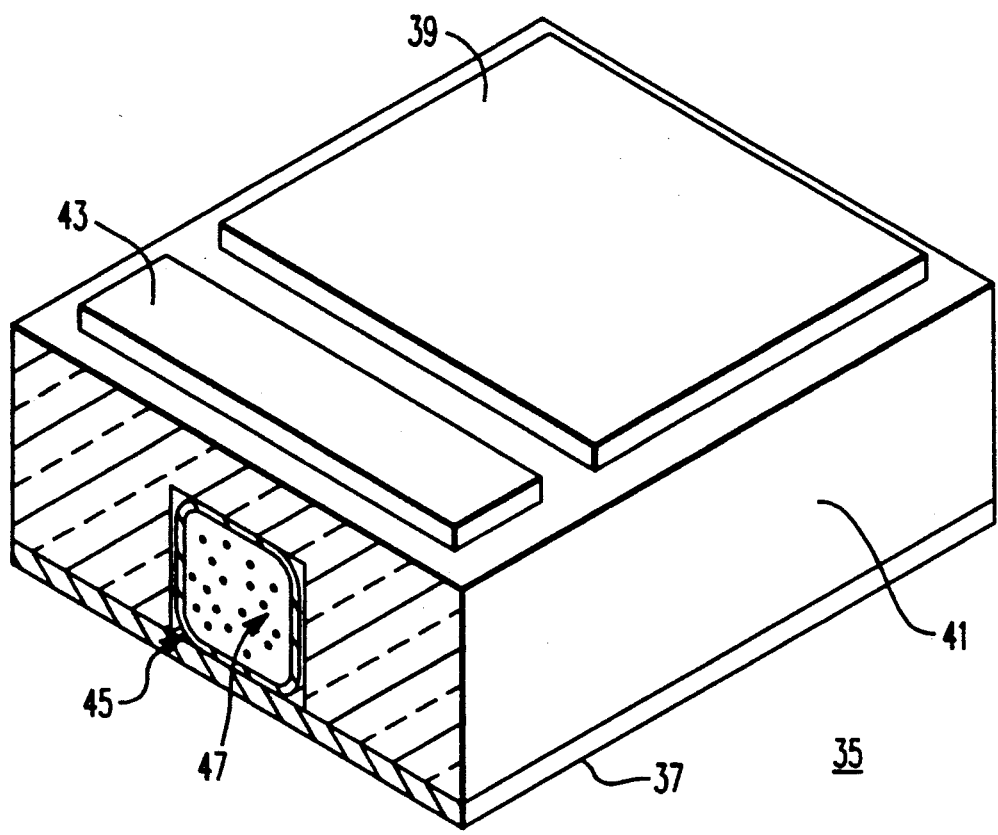
FIG. 4 is a plan view of one embodiment of a microstrip exciter.

The microwave cavity of a cell type atomic frequency standard can also be replaced by the microstrip exciter 35 of FIG. 4. In this figure, a ground plane 37 and a conducting strip 39 are separated by a dielectric material 41. The conducting strip 39 is operable to carry the signal from the oscillator of an atomic frequency standard, which is provided at input connection 43 and is inductively coupled to the conducting strip 39. The conducting strip 39 is preferably at or near a resonant length for a signal at the target frequency. These components, acting as a conventional microstrip resonator, are coupled electromagnetically to a gas cell 45 which contains an alkali vapor 47. The gas cell 45 is a sealed container positioned in a channel formed in the dielectric material 41. Because the wavelength of the signal passing through the dielectric material is appreciably shorter than the wavelength of the signal passing through vapor, the overall size of the microstrip exciter 35 is significantly smaller than prior art resonant cavity designs.

The microstrip exciter 35 of FIG. 4 can be designed using calculational techniques known in the art for modelling the effects of electromagnetic radiation. For a target frequency of 9.19 GHz, a line impedance of 50 ohms, and a dielectric material constant of 4, the approximate size of a microstrip exciter 35 is 10 mm in length, 9 mm in width, and 5 mm in height, with corresponding gas cell dimensions of 3 mm width, 3 mm height and 10 mm length. The length of the gas cell 45 is preferably the same as a half wavelength conducting strip 39. Use of a shorter length is acceptable, but cells significantly longer than a half wavelength have the disadvantage that the additional length is not subjected to the higher electromagnetic fields associated with the resonant section.

The microstrip exciter 35 of FIG. 4 is fabricated using fabrication techniques which are known in the art. The materials of construction of the microstrip exciter 35 can vary to accommodate different design frequencies and dimensional limitations. The ground plane 37 and resonant length conducting strip 39 are conductors, such as copper or gold. The gas cell 45 and the dielectric material 41 can be made from one piece of bulk material, or the gas cell 45 can be a separate piece inserted into a hole bored into the length of the dielectric material 41. The dielectric material is typically glass or sapphire, or quartz. If the gas cell 45 and dielectric material 41 are one piece quartz, the quartz must be lined with a suitable coating to prevent attack by the alkali vapor. The materials of construction interact with other variables in the design to affect the overall dimensions of the microstrip exciter 35. For example, increasing the dielectric constant has the effect of decreasing the wavelength and the characteristic impedance, thereby reducing the size of the component.

Figure 5:
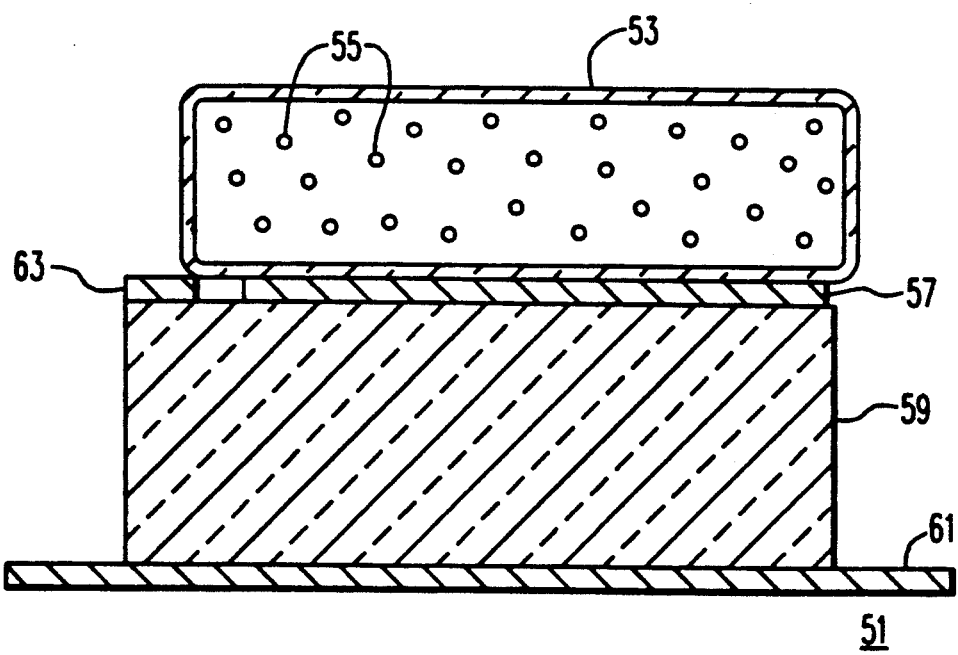
FIG. 5 is a cross sectional view of a second embodiment of a microstrip exciter.
Figure 6:
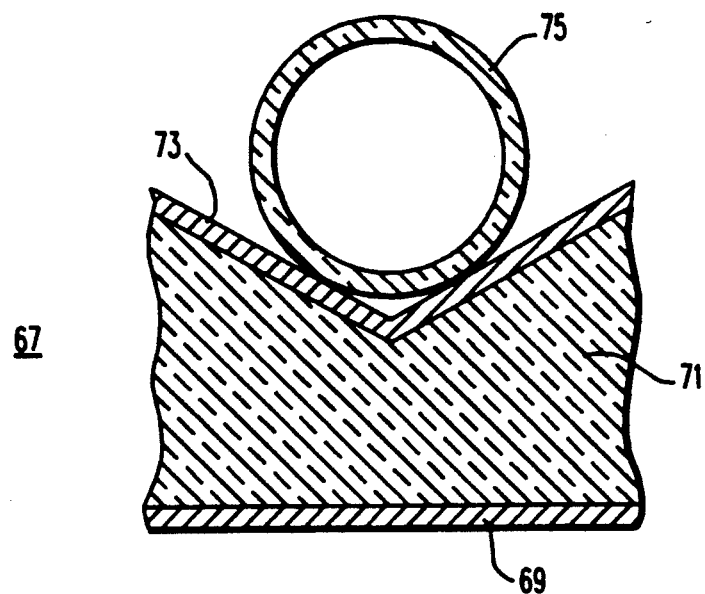
FIG. 6 is a cross-sectional view of a V-groove microstrip exciter.

FIG. 5 illustrates a cross sectional view of another embodiment of a microstrip exciter 51. In this embodiment, the microstrip exciter 51 has a gas cell 53 containing a vapor 55 positioned on top of a conducting strip 57. Here again, a dielectric material 59 separates the conducting strip 57 from the ground plane 61. Microwave power is provided to the conducting strip 57 through input conductor 63. The electromagnetic field in this device consists of closed loops of energy surrounding the conducting strip 57. While the intensity of the field is maximized in the area between the conducting strip 57 and the ground plane 61, some of the field lines do pass through the position of the gas cell 53, thus providing the required electromagnetic coupling. The gas cell 53 can be placed directly on the conducting strip 57 or located sufficiently near to operatively couple the signal to the vapor 55. Coupling efficiency for this type of device can be improved if the conducting strip and dielectric material are shaped to have the form of a V-groove, with the gas cell positioned in the valley of the V-groove. FIG. 6 illustrates this type of V-groove microstrip exciter 67, which consists of a ground plane 69, dielectric material 71, a conducting strip 73 which is in the shape of a V-groove, and a gas cell 75. A description of V-groove microstrip line is contained in *Characteristics of Valley Microstrip Lines for use in Multilayer MMIC's* by T. Hasegawa, S. Banba, H. Ogawa, and H. Nakamoto, published IEEE Microwave and Guided Wave Letters, Volume 1, Number 10, October 1991, incorporated by reference herein.

The only rigid constraint on the size of the gas cell of an atomic frequency standard is that it be compatible with the resonator design. However, the performance of a properly optimized device is expected to be a monotonic function of cell volume, for the following reasons. The short-term stability of a cell type frequency standard depends on the product of the Q of the hyperfine absorption line and the signal-to-noise ratio (S/N) of the detected optical signal. If the cell's volume is reduced, both of these factors tend to deteriorate. A decrease in the cell volume broadens the hyperfine absorption line through more rapid interaction of the vapor atoms with the cell walls. This effect can be mitigated by an increase in the buffer gas density, however, the accompanying collisional quenching limits this mitigation.

The S/N ratio is normally determined by the optical shot noise and is therefore expected to vary as the square root of the optical signal strength. This varies monotonically with the total number of atoms available for pumping, and thus will decrease as the cell's volume decreases. Increasing the vapor atom density by raising the pressure/temperature can partially restore the S/N, limited by the accompanying line broadening from the increased collisional interaction rate. Hence, despite optimization of the buffer gas and vapor densities, reduction of the cell volume will carry a performance penalty, due to reduced line Q and reduced S/N.

The penalty incurred by the reduction in cell volume in this invention is more than overcome by the use of laser diode pumping in place of the traditionally used discharge resonance lamp and isotopic filtering. Inexpensive laser diodes can be operated single mode, such that essentially all of the optical power lies within a frequency band much narrower than the absorption line being pumped, thereby providing highly selective and intense pumping. Additional benefits from using a laser diode include reduced space requirement and simplified optical coupling from the source to the cell and detector. However, use of a diode laser in an atomic frequency standard requires that the laser be tuned to the relevant absorption line center, and only a limited tuning range is achievable by varying the current and/or temperature of commercially available laser diodes having an internal cavity. Thus, it was not known if such diodes could be used in this application without recourse to an external cavity to facilitate wavelength control. By measuring the characteristics of a number of commercial laser diodes, it has been demonstrated that they can be stabilized at the required wavelengths. The required operating temperature and drive current were first identified approximately by viewing the laser output with an optical multichannel analyzer. The laser power transmitted through a cell containing cesium vapor and a buffer gas was then observed while scanning the laser through the absorption lines in the vicinity of 852 or 894 nm. The ground state hyperfine splitting was shown to be completely resolved, with the Voigt profiles produced by combined Doppler and collision broadening.

For an atomic frequency standard the diode laser wavelength must be stabilized indefinitely with a feedback control system to one of the absorption minima frequencies. With the laser diode temperature stabilized at a suitable value, the output can be frequency modulated by imposing a small alternating current component on the laser drive current. This causes a frequency modulation of the optical output, and it permits phase sensitivity detection of the resulting alternating current variations in the optical power transmitted through the gas cell. With this arrangement it is possible to lock the laser frequency to an absorption dip frequency for indefinite periods of time. Measurements of the bipolar error signal fluctuations indicate that a diode laser can be stabilized to approximately 100 KHz when the alternating current amplitude is 30 microamps, corresponding to an alternating current frequency of 25 MHz, using a pressure-broadened absorption peak having a width between inflection points of 1.1 GHz. This stability is more than adequate for the present purpose. An example of this technique is described in more detail in an article by T. M. Shay and Yun C. Chung entitled *400 Hz Frequency Stability of a GaAlAs Laser Frequency Locked to the $Rb(D_2)$ Line*, published in Optical Engineering, Volume 29, Number 6, June 1990, herein incorporated by reference.

An equally important issue is the degree to which the diode junction temperature needs to be stabilized. Measurements indicate that typical lasers of this type have a range of 2 to 4 degrees Centigrade over which the required wavelength can be sustained via current control. Hence, controlling the junction temperature within plus or minus 0.5 degrees Centigrade will suffice.

Figure 7:
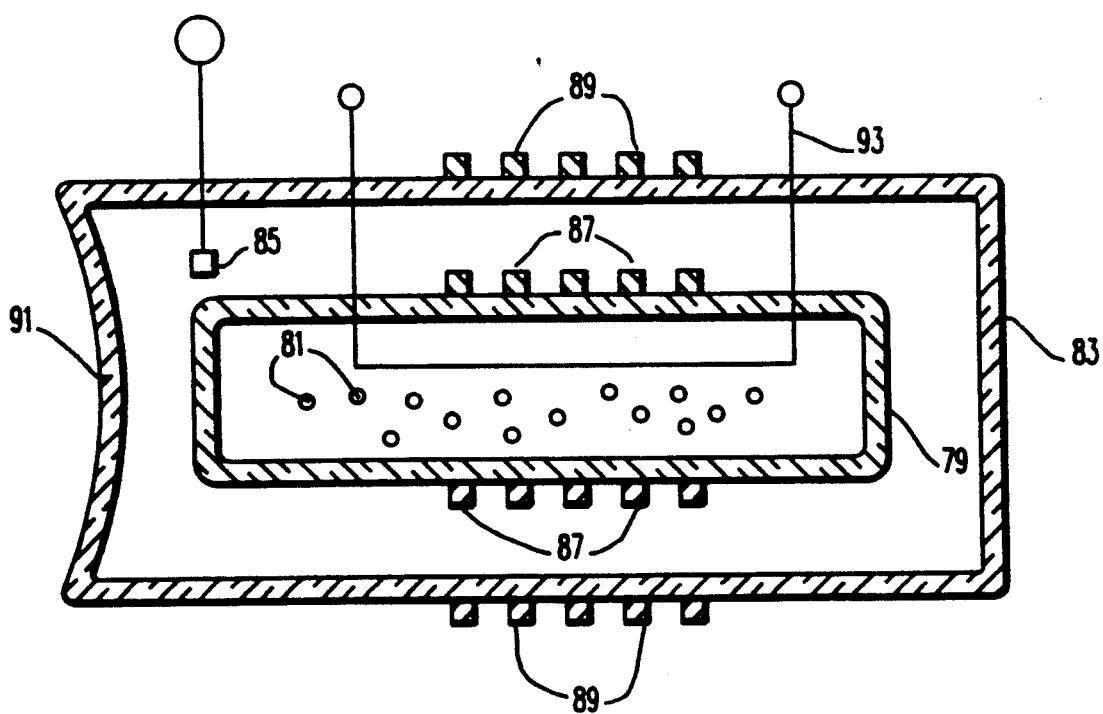
FIG. 7 is a cross-sectional view of a helical exciter illustrating a thermal insulating member with integral collimating lens and a dither signal conductor.

Temperature stability of the vapor in an atomic frequency standard is also important for maintaining the accuracy of the frequency. One manner to improve the temperature stability of such a device without sacrificing the miniaturization of the gas cell is illustrated in FIG. 7, where a gas cell 79 containing alkali vapor 81 is surrounded by a thermally insulating member 83, which can be formed from glass or other material capable of transmitting light from an external source of light (not shown). The thermally insulating member 83 can be sealed and a vacuum applied to evacuate the space between the insulating member 83 and the gas cell 79. The thermally insulating member 83 serves to isolate the gas cell 79 from temperature changes in the external environment. A temperature control device 85 can be positioned within the thermally insulating member 83 to sense and/or to control the temperature within the volume of the thermally insulating member 83. A helical conductor 87 may be formed on the gas cell 79 to provide coupling with the microwave signal, or alternatively, a helical conductor 89 may be formed on the thermally insulating member 83 if sufficient coupling can be obtained. A further adaptation of this concept is to form one or more collimating lens 91 as an integral part of the thermally insulating member 83. Such a collimating lens 91 would serve to focus the light passing through the alkali vapor 81 contained within the gas cell 79.

In some applications of an atomic frequency standard it may be desirable to produce minor controlled variations in the output frequency of the standard. For example, the frequency might be varied for use in a stabilization dither circuit. This effect can be produced by providing a conductor 93 as illustrated in FIG. 7. Voltage and current dither signals applied to the conductor 93 will induce electric and magnetic fields in the vapor 81. These fields, in turn, will produce minor changes in the fundamental transition frequency of the vapor, thereby producing a dither in the target frequency of the atomic frequency standard. This technique can also be used as part of temperature compensation circuitry whereby the signals carried by the conductor 93 are responsive to temperature variations and they serve to negate changes in the output frequency of the atomic frequency standard resulting from changes in temperature.

Once the need for a large microwave cavity and gas cell has been eliminated, further reductions in the size and weight of an atomic frequency standard can be achieved by integrating the various electrical circuits required to power and to control the standard as MOS devices onto a semiconductor substrate. The crystal oscillator 1 of FIG. 1 is preferably replaced by a high overtone bulk acoustic resonator (HBAR), such as that taught in U.S. Pat. No. No. 4,786,269 entitled "Magnetically Tuned High Overtone Bulk Acoustic Resonator" issued to Adam, et al, incorporated by reference herein. The function of the optical detector 11 of FIG. 1 is preferably performed by a silicon PIN diode, also formed on the common semiconductor substrate. The function of the source of light 9 of FIG. 1 is provided by a diode laser. Commercially available diode lasers are prepackaged and can be affixed to a semiconductor substrate or mounted as a discrete component.

The microwave digital and analog control circuits required for the atomic frequency standard can be combined on a single gallium arsenide semiconductor wafer using techniques known in the art. Alternatively, a silicon semiconductor wafer can be utilized to reduce the cost of the device, preferably a wafer formed using the Microx TM process. Microx is an unregistered trademark of the Westinghouse Electric Corporation. The Microx process is described in co-pending patent application Ser. No. 07/583,059, herein incorporated by reference.

Figure 8:
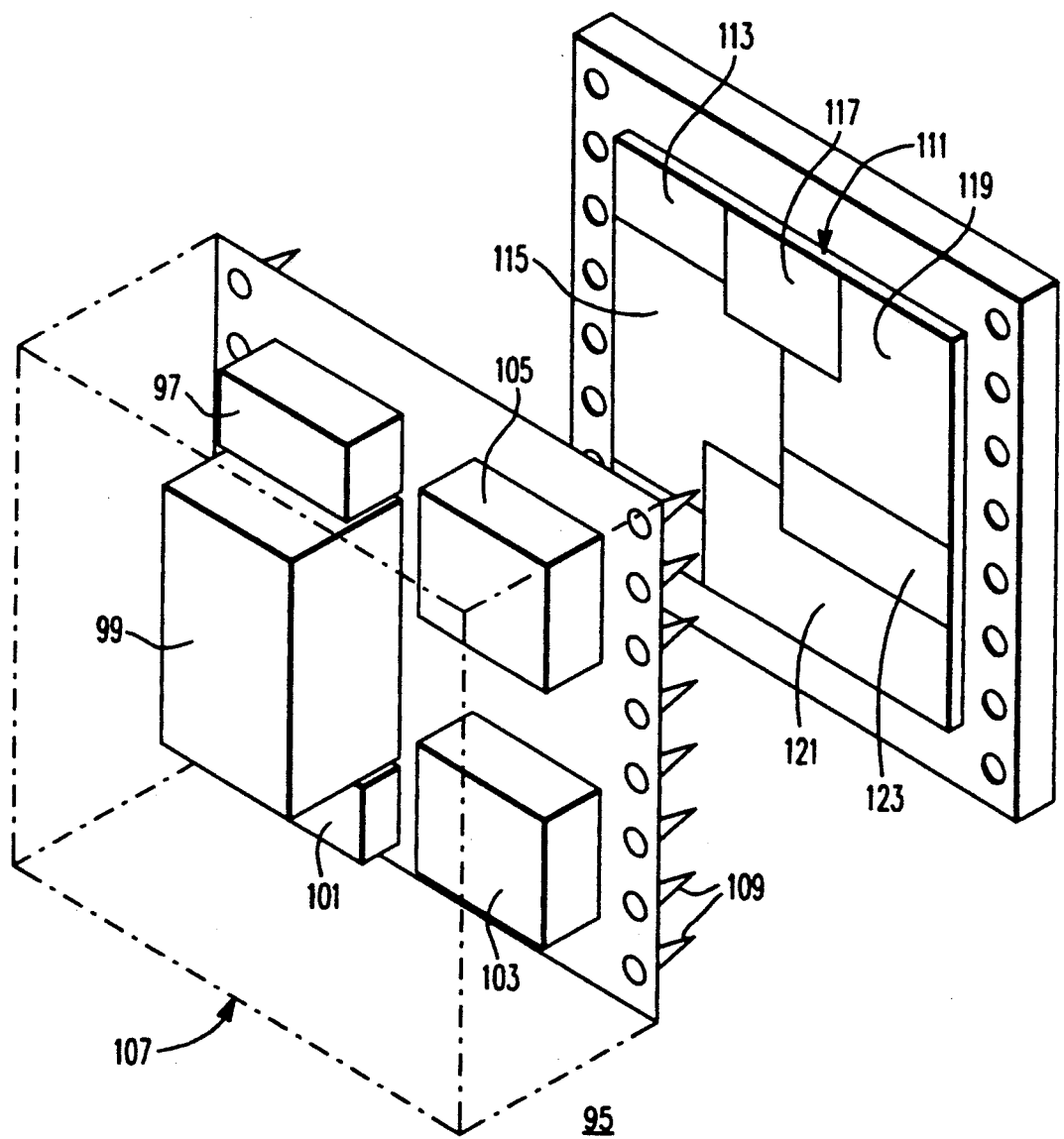
FIG. 8 is a schematic representation of the layout of an atomic frequency standard in accordance with this invention.

FIG. 8 is a schematic representation of the layout of an atomic frequency standard 95 embodying this invention. A laser diode light source 97, a miniaturized cesium gas cell and microwave exciter 99, PIN diode optical detector 101, HBAR oscillator 103, and power modules 105 are mounted in a constant temperature housing 107, which can measure approximately 2 cm by 3 cm by 1 cm. These components are connected by connectors 109 to a semiconductor substrate 111 upon which are fabricated the circuits for laser drive 113, microwave drive 115, voltage controlled oscillator 117, frequency control 119, and temperature control 121. Output circuitry 123 can also be included to convert the frequency standard signal to a measure of time.

Figure 9:
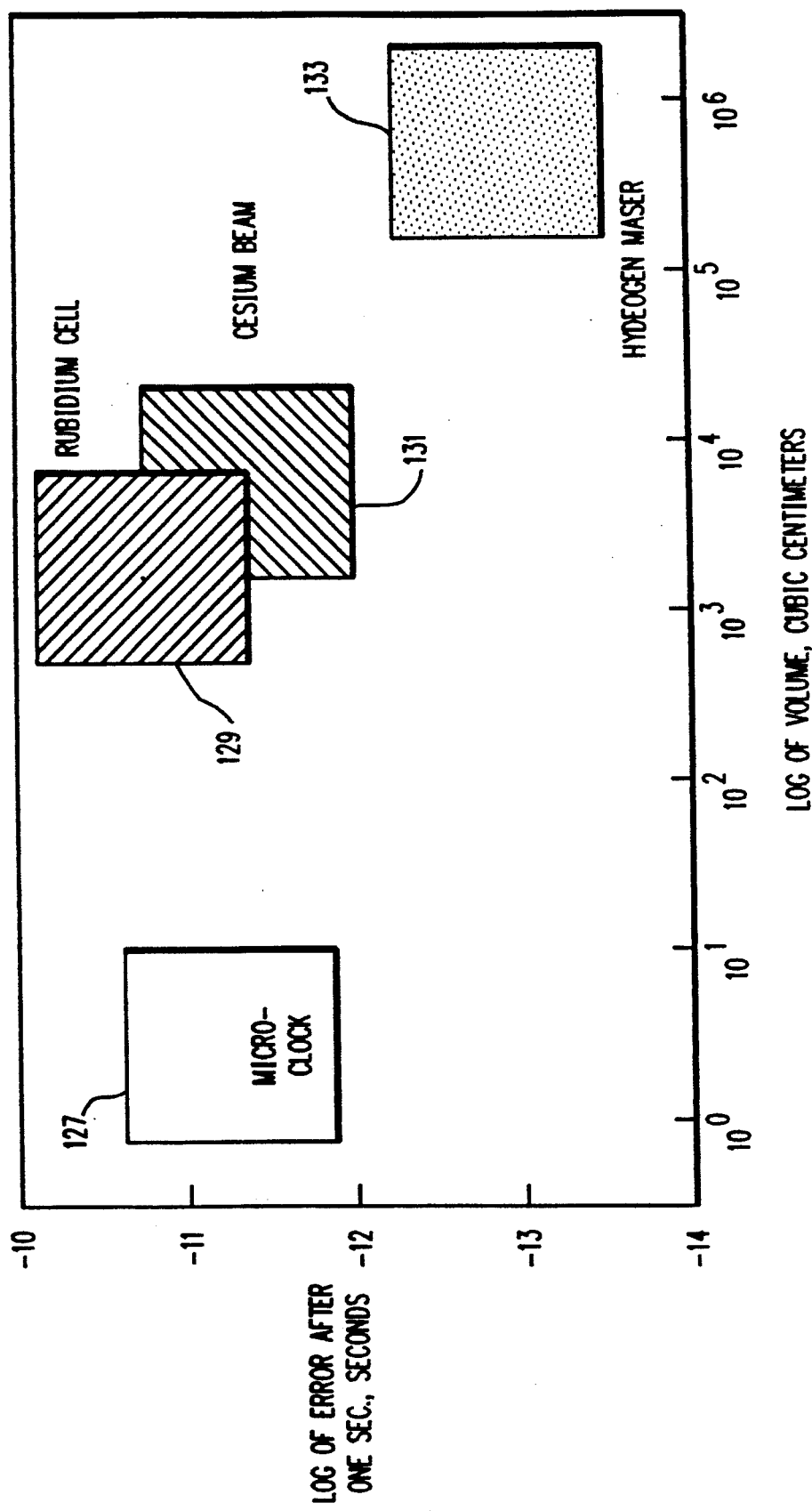
FIG. 9 is a graphical representation of the relative size and accuracy of an atomic frequency standard built in accordance with this invention when compared to prior art devices.

The entire volume of an atomic frequency standard built in accordance with this invention can be less than 12 cubic centimeters. The stability of such a device can be on the order of $4-6 \times 10^{-12}$ for a one second averaging time. FIG. 9 illustrates how the combination of size and accuracy of this invention 127 relates to the size and accuracy of prior art devices such as a rubidium cell device 129, cesium beam device 131, and a hydrogen maser 133. An atomic frequency standard built in accordance with this invention provides a reduction in size on the order of two orders of magnitude without a loss of stability, thus representing a significant advancement in the art of atomic frequency standards.

This disclosure reveals the preferred embodiment of the invention. However, variations in the form, construction and arrangement of components and the modified application of the invention are possible without departing from the scope of the invention as claimed.

We claim:

1. An atomic frequency standard comprising:
   an oscillator operable to generate a microwave signal;
   a gas cell;
   a vapor contained in said gas cell;
   a conductor connected to said oscillator, said conductor being located sufficiently near said gas cell to operatively couple said microwave signal to said vapor;
   a laser diode operable to generate light and positioned such that said light passes through said vapor;
   means for detecting said light having passed through said vapor;
   means for controlling the frequency of said microwave signal in response to the amount of light detected by said detecting means;
   wherein the circumference of said gas cell is no more than one-half the wavelength of said signal.

2. An atomic frequency standard as in claim 1, wherein said conductor is formed as a helix on an outside surface of said gas cell.

3. An atomic frequency standard as in claim 1, wherein said conductor is formed to be an LC gap conductor on an outside surface of said gas cell.

4. An atomic frequency standard as in claim 1, wherein said gas cell has outside dimensions of no more than 6 mm diameter by 18 mm length.

5. An atomic frequency standard as in claim 1, wherein the internal volume of said gas cell is no more than 100 cubic millimeters.

6. An atomic frequency standard as in claim 1, having a total volume of less than 12 cubic centimeters.

7. An atomic frequency standard as in claim 1, further comprising circuitry for said oscillator, laser diode and frequency control means being formed on a single semiconductor substrate.

8. An atomic frequency standard as in claim 1, wherein said detecting means comprises a PIN diode detector.

9. An atomic frequency standard as in claim 1, further comprising a thermally insulating member surrounding said gas cell.

10. An atomic frequency standard as in claim 9, further comprising means for controlling the temperature within said thermally insulating member.

11. An atomic frequency standard as in claim 9, further comprising a collimating lens formed as an integral part of said thermally insulating member.

12. An atomic frequency standard as in claim 1, further comprising a second conductor having a section which passes through said gas cell, said second conductor operable to carry a dither signal for varying the output frequency of said atomic frequency standard.

13. An atomic frequency standard as in claim 1, further comprising a conducting coil formed around said gas cell, said conducting coil being operative as a heating coil.

14. An atomic frequency standard as in claim 13, wherein said conducting coil comprises a bifilar coil.

15. An atomic frequency standard comprising:
an oscillator operable to generate a microwave signal;
a gas cell;
a vapor contained in said gas cell;
a microstrip exciter connected to said oscillator, said microstrip exciter being positioned sufficiently near said gas cell to operatively couple said signal to said vapor;
a laser diode operable to generate light and positioned such that said light passes through said vapor;
means for detecting said light having passed through said vapor;
means for controlling the frequency of said microwave signal in response to the amount of light detected by said detecting means.

16. An atomic frequency standard as in claim 15, wherein said microstrip exciter comprises a conducting strip operable to carry said microwave signal, and a ground plane opposed said conducting strip and separated from said conducting strip by dielectric material, said gas cell being disposed on said conducting strip opposed said dielectric material.

17. An atomic frequency standard as in claim 16, wherein said conducting strip is shaped as a V-groove.

18. An atomic frequency standard as in claim 15, wherein said microstrip exciter comprises a conducting strip operable to carry said microwave signal, and a ground plane opposed said conducting strip and separated from said conducting strip by dielectric material, said gas cell being disposed between said ground plane and said conducting strip.

19. An atomic frequency standard as in claim 15, further comprising a conducting coil formed around said gas cell.

20. An atomic frequency standard as in claim 19, wherein said conducting coil comprises a bifilar coil.

21. An atomic frequency standard as in claim 15, further comprising said gas cell being thermally isolated by vacuum encapsulation.

22. An atomic frequency standard as in claim 15, further comprising said oscillator, microstrip exciter, and frequency control means being formed on a single semiconductor substrate.

23. An atomic frequency standard comprising:
a gas cell;
a vapor contained in said gas cell;
an oscillator operable to generate a microwave signal;
a conductor formed near an outside surface of said gas cell and connected to said oscillator, said conductor operable to couple said microwave signal to said vapor;
a laser diode operable to generate light and positioned such that said light passes through said vapor;
means for detecting said light having passed through said vapor;
means for controlling the frequency of said microwave signal in response to the amount of light detected by said detecting means.

24. An atomic frequency standard as in claim 23, wherein said conductor is formed as a non-radiating helix.

25. An atomic frequency standard as in claim 23, wherein said conductor is formed as an LC gap conductor.

26. An atomic frequency standard as in claim 23, wherein said conductor is a first conductor, and further comprising a second conductor formed as a coil around said gas cell.

27. An atomic frequency standard as in claim 26, wherein said second conductor comprises a bifilar coil.

28. An atomic frequency standard as in claim 23, further comprising said gas cell being thermally isolated by vacuum encapsulation.

29. An atomic frequency standard as in claim 23, wherein said conductor is a first conductor, and further comprising a second conductor formed as a coil around said gas cell.

30. An atomic frequency standard as in claim 29, wherein said second conductor comprises a bifilar coil.

* * * * *